United States Patent [19]

Nagy et al.

[11] Patent Number: 4,717,446
[45] Date of Patent: Jan. 5, 1988

[54] METHOD OF DETECTING THE ENDPOINT OF THE ETCH OF EPITAXIALLY GROWN SILICON

[75] Inventors: Andrew G. Nagy; Donald K. Stemple; Clarence J. Tracy, all of Tempe, Ariz.

[73] Assignee: Motorola Inc., Schaumburg, Ill.

[21] Appl. No.: 909,043

[22] Filed: Sep. 18, 1986

[51] Int. Cl.$^4$ .......................................... H01L 21/306
[52] U.S. Cl. .................................. 156/626; 156/627; 156/643; 156/646
[58] Field of Search ............... 156/626, 627, 345, 643, 156/646; 148/175

[56] References Cited

U.S. PATENT DOCUMENTS 4,367,044 1/1983 Booth, Jr. et al. .............. 156/626 X
4,435,898 3/1984 Gaur et al. ...................... 156/643 X Primary Examiner—S. Leon Bashore
Assistant Examiner—Thi Dang
Attorney, Agent, or Firm—Raymond J. Warren

[57] ABSTRACT

A method of detecting the endpoint of expitaxially grown silicon using a monitor wafer is described. A monitor wafer having a substrate, an oxide layer, and a polysilicon layer is process in an epi chamber along with working wafers. The monitor wafer is used to determine the endpoint of the working wafers epi layer when the epi layer is etched.

13 Claims, 6 Drawing Figures

METHOD OF DETECTING THE ENDPOINT OF THE ETCH OF EPITAXIALLY GROWN SILICON

BACKGROUND OF THE INVENTION

The present invention relates, in general, to a method of etch endpoint detection and, more particularly, to a method of detecting the endpoint of the etch of epitaxially grown silicon.

Several techniques are known for endpoint detection of other films typically used in IC processing. Included among these are mass-spectrometric, optical interferometric, and fluorescence detection of a sacrificial coating material (as described in U.S. Pat. No. 4,482,424). These techniques have the common drawback that they do not readily lend themselves to endpoint detection of epitaxially grown silicon.

The mass-spectrometric analysis of an etching plasma is employed to determine resist etch endpoint. For example, when a reaction product typical of the substrate is detected in the mass-spectrometric analysis of the plasma, then the interface between the resist and the substrate is assumed to have been reached, and the etching is discontinued. In the present application there is no resist/substrate interface to be detected. In addition, from the time etching of the substrate starts to the time detection is made of the underlying substrate and etching stopped, part of the substrate is already etched.

In the optical interferometric technique, light is shown on a film undergoing etching; a portion of the reflected light is detected; and the intensity of the detected light is recorded. Etch endpoint is generally detected by looking for sharp changes in slope, or sharp changes in the oscillation frequency, or the detected signal. However, the slope of the output signal does not always change abruptly at the endpoint, particularly if the substrate has optical properties similar to those of the etching film (i.e. when an epitaxial layer is being etched).

The fluorescence detection technique requires that a layer of fluorescent material be placed on the wafer and that a fluorescence detector be used to determine when the fluoresce level has dropped below a certain standard. This would only be applicable if a fluorescence detector were utilized in a production line.

SUMMARY OF THE INVENTION

Accordingly, it is an object of the present invention to provide a method of detecting the endpoint of epitaxially grown silicon that overcomes the above deficiencies.

Another object of the present invention is to provide a method of detecting the endpoint of epitaxially grown silicon that is compatible with existing processing techniques.

Yet another object of the present invention is to provide a method of detecting the endpoint of epitaxially grown silicon that utilizes laser interferometry.

Still another object of the present invention is to provide a method of detecting the endpoint of epitaxially grown silicon that is cost effective to implement in existing processes.

The above and other objects and advantages of the present invention are provided by the method of detecting an endpoint of epitaxially grown silicon that is described herein.

A particular embodiment of the present invention consists of a method comprising the steps: fabricating a working wafer having a silicon substrate and a monitor wafer having a substrate, a layer of oxide on the substrate, and a layer of polysilicon on the oxide; growing an epitaxial layer on the working and monitor wafers; and etching the wafers until the endpoint between the polysilicon and the oxide layers of the monitor wafer is detected.

DETAILED DESCRIPTION OF THE DRAWINGS

Figure 1A:
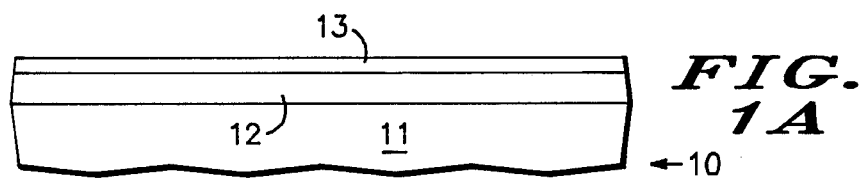
FIGS. 1A and 1B are cross sectional views of a monitor wafer utilized in the present invention.

The present invention, in one particular embodiment, utilizes a monitor wafer, generally designated 10, a cross section of which is shown in FIG. 1A. Monitor wafer 10 consists of a silicon substrate 11 having an oxide layer 12 and a polysilicon layer 13 deposited thereon. In one particular embodiment, layer 12 would be 1000 Angstroms and layer 13 would be 500 Angstroms thick.

Figure 2A:
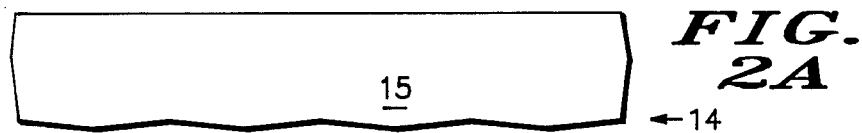
FIGS. 2A and 2B are cross sectional views of a prior art wafer.
Figure 2B:
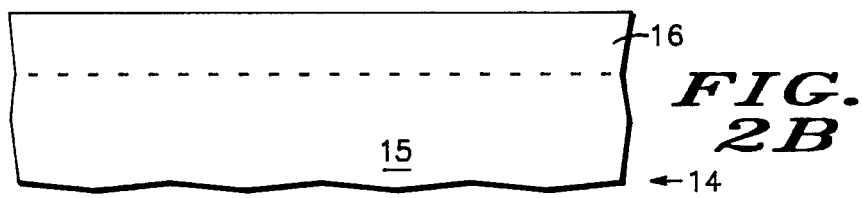

In FIG. 2A a prior art working wafer 14 is illustrated having a silicon substrate 15. In processing, wafer 14 is placed in an epi reactor to grow an epi layer 16 on substrate 15, FIG. 2B. Since epi layer 16 takes on the same configuration as the layer it is grown on, substrate layer 15, there is no line of separation shown between the two layers.

Figure 1B:
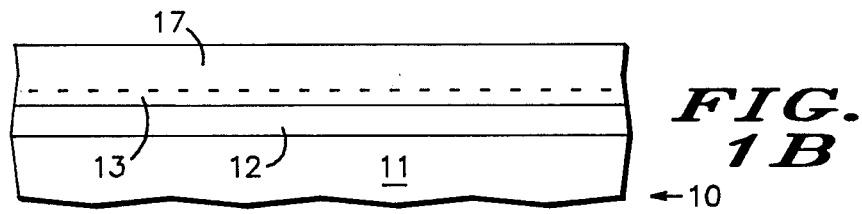

Monitor wafer 10 is also placed in the epi reactor at the same time as wafer 14. This produces an epi-poly layer 17, FIG. 1B, on poly layer 13 of monitor wafer 10. Both epi layers, 16 and 17, are of the same thickness and in one particular embodiment are 2 microns thick.

Figure 3:
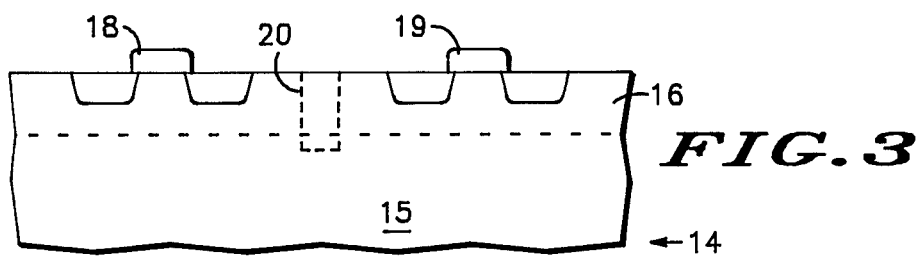
FIG. 3 is a cross sectional view of the prior art wafer of FIGS. 2A and 2B.

At this point monitor wafer 10 is removed from the process and saved for later use. Wafer 14 then continues to be processed until epi layer 16 is to be etched. One particular example of wafer 14 that has been processed is shown in FIG. 3. FIG. 3 is a cross sectional view of wafer 14 with two transistors, 18 and 19, formed thereon. At this point, a trench, illustrated by dashed line 20, is to be etched through epi layer 16 to substrate 15. This trench is used to provide electrical separation between transistors 18 and 19.

To produce trench 20, monitor wafer 10 is placed back in the process with working wafer 14. Both wafers are then etched in a fashion that will allow monitoring using laser interferometry. The etch rate of monitor wafer 10 is measured until the signal indicates that epi layer 17 and poly layer 13 have been etched thru.

Figure 4:
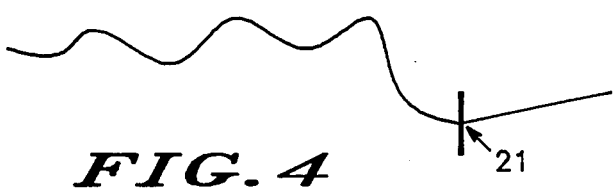
FIG. 4 is a graph of light reflected from the monitor wafer of FIG. 1B as it is etched.

A laser is used to measure the etch rate of monitor wafer 10 by measuring the reflected light off of oxide layer 12. A graph of the reflected light is shown in FIG. 4. The graph shows that the intensity of the reflected light forms a sinusoidal pattern while etching through layers 17 and 13. This occurs because of successive constructive and destructive interferences between light rays reflected from the underlying interface between layers 12 and 13. At the time layer 13 has been etched thru, the graph takes a slight jump and then a deep trough. Point 21 indicates where the endpoint between layers 13 and 12 is located.

Wafer 14 is being etched at the same time as monitor wafer 10. In this particular embodiment, the 2 microns of epi 16 would be etched thru, which coincides with the thickness of epi layer 17. Next, 500 Angstroms of substrate 15 are etched thru, which coincides with the thickness of poly layer 13. The etching of substrate 15 can be reduced by reducing the thickness of poly layer 13. However, for the purposes of the present embodiment, an over etch of 0.05 microns is acceptable.

It should be noted here that the above described process is most efficient if used in batch processing. If the processing of the working wafers is such that they are individually processed, it may be more desirable to utilize one of the dice as a monitor. The particular dice would have a layer of oxide and poly on the substrate prior to epi growth. This particular die is then monitored during the etching stage to determine the endpoint.

Thus, it is apparent to one skilled in the art that there has been provided in accordance with the invention, a device and method that fully satisfies the objects, aims and advantages set forth above.

It has been shown that the present invention provides a method of detecting endpoints in epitaxially grown layers that is compatible with existing processes and processing equipment.

While the invention has been described in conjunction with specific embodiments thereof, it is evident that many alterations, modifications, and variations will be apparent to those skilled in the art in light of the foregoing description. Accordingly, it is intended to embrace all such alterations, modifications and variations in the appended claims.

We claim:

1. A method of detecting the endpoint of epitaxially grown silicon comprising the steps of:
   providing a working wafer having a silicon substrate;
   providing a monitor wafer having a substrate, an oxide layer disposed on said substrate, and a polysilicon layer disposed on said oxide layer;
   growing an epitaxial layer on said working wafer and said monitor wafer simultaneously;
   etching said working wafer and said monitor wafer;
   detecting an endpoint between said polysilicon layer and said oxide layer of said monitor wafer using a laser; and
   halting said etching when said endpoint is detected by said laser.

2. The method of claim 1 wherein said epitaxial layer grown on said working wafer is an epitaxial silicon layer.

3. The method of claim 1 wherein said epitaxial layer grown on said monitor wafer is an epitaxial polysilicon layer.

4. The method of claim 1 wherein said step of etching is a dry etching.

5. The method of claim 4 wherein said dry etching is a plasma etching.

6. The method of claim 1 wherein said step of detecting said endpoint is performed by laser interferometry.

7. A method of detecting the endpoint of epitaxially grown silicon comprising the steps of:
   providing a working wafer having a silicon substrate;
   providing a monitor wafer having a substrate, an oxide layer disposed on said substrate, and a polysilicon layer disposed on said oxide layer;
   growing an epitaxial layer on said working wafer and said monitor wafer simultaneously;
   processing said working wafer;
   etching said working wafer and said monitor wafer;
   detecting an endpoint between said polysilicon layer and said oxide layer of said monitor wafer using a laser; and
   halting said etching when said endpoint is detected by said laser.

8. The method of claim 7 wherein said epitaxial layer grown on said working wafer is an epitaxial silicon layer.

9. The method of claim 7 wherein said epitaxial layer grown on said monitor wafer is an epitaxial polysilicon layer.

10. The method of claim 7 wherein said step of etching is a dry etching.

11. The method of claim 10 wherein said dry etching is a plasma etching.

12. The method of claim 7 wherein said step of detecting said endpoint is performed by laser interferometry.

13. A method of detecting the endpoint of epitaxially grown silicon comprising the steps of:
   providing a working wafer having a silicon substrate;
   providing a monitor wafer having a substrate, an oxide layer disposed on said substrate, and a polysilicon layer disposed on said oxide layer;
   growing an epitaxial layer of silicon on said working wafer and an epitaxial layer of polysilicon on said monitor wafer simultaneously;
   processing said working wafer;
   etching said working wafer and said monitor wafer using a plasma etcher;
   detecting an endpoint between said polysilicon layer and said oxide layer of said monitor wafer using laser interferometry; and
   halting said etching when said endpoint is detected by said laser.

* * * * *